United States Patent
Yamazaki et al.

Patent Number: 5,323,948
Date of Patent: Jun. 28, 1994

[54] WIRE CLAMPER

[75] Inventors: Nobuto Yamazaki; Koichi Harada; Minoru Torihata; Mitsuaki Sakakura; Takayuki Iiyama, all of Tokyo, Japan

[73] Assignee: Kabushiki Kaisha Shinkawa, Tokyo, Japan

[21] Appl. No.: 31,237

[22] Filed: Mar. 12, 1993

[30] Foreign Application Priority Data

Mar. 12, 1992 [JP] Japan .................................. 4-087454

[51] Int. Cl.[5] .............................................. H01L 21/60
[52] U.S. Cl. ..................................... 228/4.5; 228/49.5
[58] Field of Search .................... 228/1.1, 4.5, 13, 47, 228/179, 49.5, 180.5

[56] References Cited

U.S. PATENT DOCUMENTS 4,854,494 8/1989 von Raben ........................... 228/102

FOREIGN PATENT DOCUMENTS

| | | | |
|---|---|---|---|
| 57-159034 | 10/1982 | Japan | 228/4.5 |
| 60-227433 | 11/1985 | Japan | 228/4.5 |
| 61-2294 | 1/1986 | Japan . | |
| 61-79238 | 4/1986 | Japan | 228/4.5 |
| 61-101042 | 5/1986 | Japan | 228/4.5 |
| 2-130844 | 5/1990 | Japan | 228/4.5 |

Primary Examiner—Samuel M. Heinrich
Attorney, Agent, or Firm—Koda and Androlia

[57] ABSTRACT

A pair of clamping arms of a wire clamper used in a wire bonding apparatus being opened and closed via the electric strain effect or magnetic strain effect of a piezoelectric element. With the use of a piezoelectric element that expands when energized to open the clamping arms so as to release the wire held by the clamping arms, the overall weight of the wire clamper can be small, a quick clamping action is secured and the clamping force which is easily adjustable can be steady at a set value.

4 Claims, 1 Drawing Sheet

WIRE CLAMPER

BACKGROUND OF THE INVENTION

1. Field of the Invention

The present invention relates to a wire clamper used in a wire bonding apparatus.

2. Prior Art

Japanese Patent Application Publication (Kokoku) No. 61-2294 discloses one of the conventional wire clampers.

This wire clamper includes a movable arm and a fixed arm. The movable arm is urged toward the fixed arm by a spring, and the movable arm is opened and closed by a solenoid. When the solenoid is energized, the movable arm is pushed by the projecting rod of the solenoid, overcoming the driving force of the spring. The movable ar is thus opened. When the power to the solenoid is cut off, the movable arm is closed by the spring, thus holding the wire between the movable arm and the fixed arm.

Since this prior art clamper uses a solenoid to open and close the arm parts of the clamper, there are several problems. The overall weight of the clamper tends to be heavy, and the clamping action or the response of the clamper is slow. In addition, since the load which retains the wire (i. e., the clamping load) is obtained by the driving force of the spring, which is approximately 40 to 50 g, the movable arm tends to be unsteady when the bonding head moves at high speed. This means that the clamping load is unstable. Moreover, since the clamping load is obtained by the spring, the spring must be replaced when the amount of clamping load needs to be changed. In addition, a desired clamping load is usually not obtained easily, and the adjustment of the clamping load requires a considerable amount of time.

SUMMARY OF THE INVENTION

Accordingly, the primary object of the present invention is to provide a light-weight wire clamper which has improved response characteristics and provides a steady clampinq load.

Another object of the present invention is to provide a wire clamper in which the clamping load can easily be adjusted.

The objects of the present invention are accomplished by a unique structure for a wire clamper which is a part of a wire bonding apparatus and has a pair of arm parts or clamping arms that open and close to clamp or hold a wire, and the unique structure of the present invention is that the opening and closing of at least one of the arm parts is accomplished by means of the electric strain effect or magnetic strain of a piezoelectric element.

Since the opening and closing of the arm parts is accomplished by a piezoelectric element, the weight of the wire clamper can be light, and the response characteristics of the wire clamper are conspicuously improved. In addition, since the clamping load is obtained by the driving force of a piezoelectric element that opens and closes the arm parts, there is no unsteadiness of the clamping parts even when the bonding head is moved at a high speed. Accordingly, the clamping load can be stabilized. In addition, since the amount of the clamping load depends on the voltage value that is applied to the piezoelectric element, the clamping load can easily be set at a desired level.

DETAILED DESCRIPTION OF THE INVENTION

Figure 1:
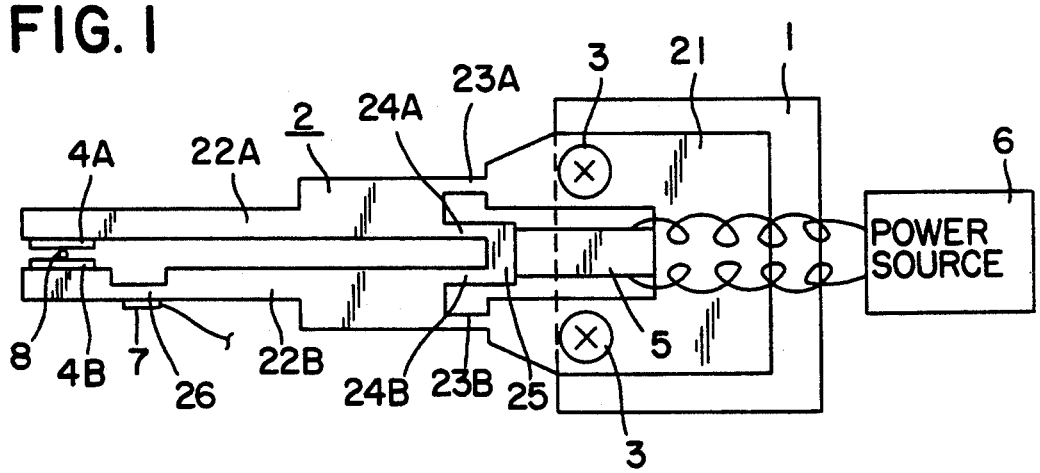
FIG. 1 is a top view which illustrates one embodiment of the wire clamper according to the present invention.

The first embodiment of the present invention will be described below with reference to FIGS. 1 and 2.

The clamper 2 is fastened to a clamper support 1 which is secured to a wire bonding apparatus. The clamper 2 is comprised of a clamper base 21 and a pair of clamping arms 22A and 22B. The clamper base 21 is secured to the clamper support 1 by screws 3, and each one of the pair of clamping arms 22A and 22B has a clamping piece 4A and a clamping piece 4B.

Constricted areas 23A and 23B which are elastically deformable are formed in the area where the clamping arms 22A and 22B are connected to the clamper base 21. Furthermore, elastically deformable constricted areas 24A and 24B are additionally formed on the inside of the constricted areas 23A and 23B of the clamping arms 22A and 22B. These constricted areas 24A and 24B are connected to form an operating part 25. The constricted areas 23A, 23B, 24A and 24B exert a spring force in the direction in which the clamping arms 22A and 22B are closed or in the direction in which the clamping pieces 4A and 4B hold a wire 8 in between.

Furthermore, both ends of a laminated piezoelectric actuator 5 (hereafter referred to as a "piezoelectric element") are fastened to the clamper base 21 and operating part 25, respectively. This piezoelectric element 5 is driven by a piezoelectric element controlling power source 6. The piezoelectric element 5 is installed so that its strain direction is oriented in the direction of the clamping surfaces of the clamping pieces 4A and 4B.

In operation, when no voltage is applied to the piezoelectric element 5, the clamping pieces 4A and 4B hold the wire 8 in between with a certain fixed clamping load obtained (mainly) by the constricted areas of the clamping arms 22A and 22B. Then, when a voltage is applied to the piezoelectric element 5, the piezoelectric element 5 expands toward the clamping pieces 4A and 4B as a result of its electric strain effect or magnetic strain effect. As a result, the operating part 25 is moved in the same direction, i. e., toward the left in FIG. 1, and the constricted areas 23A, 23B, 24A and 24B bend outwardly so that the clamping pieces 4A and 4B are opened. The amount of shift of these clamping pieces 4A and 4B is the amount of the expansion of the piezoelectric element 5 that is magnified by the ratio between the distance from the constricted areas 23A and 23B to the surfaces of the clamping pieces 4A and 4B (which hold the wire 8) and the distance from the constricted areas 23A and 23B to the operating part 25.

Figure 2:
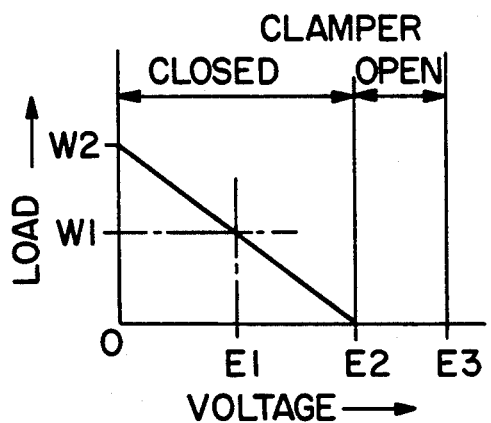
FIG. 2 is a graph showing the relationship between the clamping load and the voltage applied to the piezoelectric element used in the clamper of the present invention.

More specifically, as shown in FIG. 2, when a voltage is applied to the piezoelectric element, with the clamping load at W2, the clamping load decreases in proportion to the applied voltage. When the voltage reaches E2, the clamping load becomes zero at which the clamping pieces 4A and 4B merely contacts the wire 8. When the voltage is further increased, the clamping pieces 4A and 4B are separated from the wire 8, and they are opened. Accordingly, in the actual wire bonding operation, the clamping load W1, which is most desirable for clamping or holding the wire 8, is at the voltage value of E1. Thus, a desired clamping load can be determined by measuring the relationship between the voltage and the clamping load beforehand and then lowering the voltage by a fixed amount from the voltage value where the clamping pieces 4A and 4B merely contact the wire 8, i. e., from the voltage value where the clamping load is zero.

Thus, in actual use, the voltage is set so that it is at E1 when the wire is held, and at E3 when the wire is released. In one concrete example, the clamping load W2 is approximately 80 to 100 g when the voltage is zero, and the clamping pieces 4A and 4B are separated from the wire 8 by a distance of approximately 50 to 70 microns when the applied voltage E3 is 100V. In this case, the wire clamper is set so that the clamping load W1 is approximately 40 to 50 g when the applied voltage E1 is approximately 50 to 60V.

As seen from the above, the opening and closing of the clamping arms 22A and 22B is accomplished by means of the piezoelectric element 5. Therefore, though the weight of the solenoid used in conventional devices is approximately 20 to 30 g, the weight of the piezoelectric element 5 used in the present embodiment is approximately 0.5 to 5 g, and the overall weight of the apparatus is thus significantly smaller. Furthermore, the response time of the solenoid is 1.5 to 2.0 ms, while the response time of the piezoelectric element 5 is 0.05 to 3.0 ms. Thus, the response time is conspicuously improved. Moreover, in conventional devices, since the clamping load is obtained by the spring, the clamping pieces are unsteady when the bonding head is moved at high speed. On the other hand, since the piezoelectric element 5 is used in the present embodiment which has a large driving force, the rigidity of the constricted areas 23A, 23B, 24A and 24B in the clamping arms 22A and 22B is high, and there is no clamping unsteadiness of the clampinq pieces 4A and 4B even when the bonding head is moved fast. Thus, the clamping load can be stable. In the present embodiment, furthermore, since the amount of the clampinq load depends on the voltage applied to the piezoelectric element 5, the setting of the clamping load is easy.

One way to accurately measure and set the clamping load will be described below.

An elastically deformable constricted area 26 is formed near the clamping piece 4B of the clamping arm 22B, and a strain gauge 7 is mounted to this constricted area 26. With this structure, since the amount of bending of the constricted area 26 varies depending upon the clamping load, the relationship between the amount of bending and the clamping load can be ascertained by the output value of the strain gauge 7. Accordingly, by determining the relationship between the clamping load and the output value of the strain gauge 7 beforehand, the clamping load can be controlled by adjusting the voltage applied to the piezoelectric element 5 in accordance with the output value of the strain gauge 7.

Figure 3:
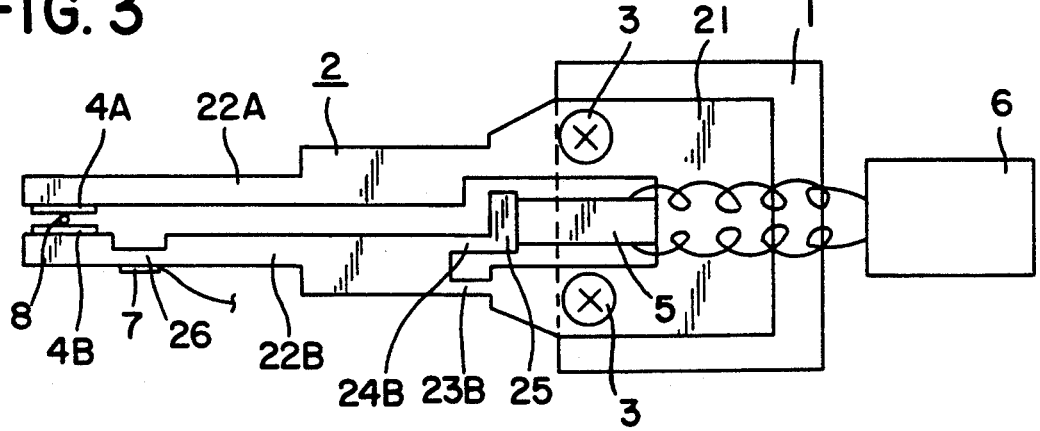
FIG. 3 is a top view which illustrates another embodiment of the wire clamper according to the present invention.

FIG. 3 illustrates another embodiment of the present invention.

In the previous embodiment described above, both of the clamping arms 22A and 22B are opened and closed. In this embodiment of FIG. 3, on the other hand, only one of the clamping arms 22B is opened and closed.

More specifically, the constricted area 23A formed in the embodiment of FIG. 1 is eliminated, and this part is made rigid. In addition, the clamping arm 22A is not connected to the operating part 25. Accordingly, in this embodiment, only the clampinq arm 22B is opened and closed via the piezoelectric element 5. The rest of the structure is the same as that shown in FIG. 1.

An effect similar to that obtained in the embodiment of FIG. 1 can be obtained using this construction. In this embodiment, however, since only one clamping arm 22B is opened and closed, it may not be possible, depending on the capacity of the piezoelectric element 5, to obtain the desired amount of opening space between the clamping pieces 4A and 4B. In this regard, the arrangement in which both of the clamping arms 22A and 22B are opened and closed as in the embodiment of FIG. 1 can obtain a larger amount of opening and is therefore more desirable.

As described in detail in the above, according to the present invention, the clamping arms are opened and closed by means of a piezoelectric element. Accordingly, the weight of the bonding apparatus can be reduced, and the response characteristics are conspicuously improved. Furthermore, since the most desirable clamping load is obtained by using the driving force of a piezoelectric element to open and close the clamping arms, there is no clamping unsteadiness even when the bonding head is moved at high speed. Accordingly, the clamping load can be steady. Moreover, since the clamping load can be changed according to the voltage applied to the piezoelectric element, the clamping load can easily be set as desired.

We claim:

1. A wire clamper used in a wire bonding apparatus with a pair of clamping arms that open and close to hold a wire, wherein said opening and closing action of at least one of said clamping arms is accomplished by means of electric strain effect or magnetic strain effect of a piezoelectric element, said wire clamper further comprising a strain gauge provided on one of said clamping arms.

2. A wire clamper for a wire bonding apparatus according to claim 1, further comprising a power source that is connected to and actuates said piezoelectric element to expand, thus opening one of said clamping arms.

3. A wire clamper for a wire bonding apparatus comprising a clamper base and a pair of clamping arms which are integral with said clamper base and open and close to hold a bonding wire in between, said wire clamper further comprising an piezoelectric element and elastically deformable constricted areas which are provided between said clamper base and said clamping arms.

4. A wire clamper for a wire bonding apparatus according to claim 3, further comprising a power source that is connected to and actuates said piezoelectric element to expand, thus opening said clamping arms.

* * * * *